(12) United States Patent
Park et al.

(10) Patent No.: US 8,535,808 B2
(45) Date of Patent: Sep. 17, 2013

(54) HEAT DISSIPATION COATING AGENT AND HEAT-DISSIPATING PLATE INCLUDING SAME

(75) Inventors: Hyo-yul Park, Changwon-si (KR); Myeong-sang Ahn, Changwon-si (KR); Dong-jun Kang, Changwon-si (KR); Dae-young Jung, Changwon-si (KR)

(73) Assignee: Korea Electrotechnology Research Institute (KR)

( * ) Notice: Subject to any disclaimer, the term of this patent is extended or adjusted under 35 U.S.C. 154(b) by 0 days.

(21) Appl. No.: 13/313,191

(22) Filed: Dec. 7, 2011

(65) Prior Publication Data

US 2012/0077040 A1    Mar. 29, 2012

Related U.S. Application Data

(63) Continuation of application No. PCT/KR2010/003052, filed on May 14, 2010.

(30) Foreign Application Priority Data

Jan. 19, 2010  (KR) .......................... 10-2010-0004895

(51) Int. Cl.
*B32B 15/04* (2006.01)
*B32B 5/16* (2006.01)

(52) U.S. Cl.
USPC ......................................... 428/450; 428/451

(58) Field of Classification Search
USPC .................................................. 428/450, 451
See application file for complete search history.

(56) References Cited

U.S. PATENT DOCUMENTS

| 4,204,021 A * | 5/1980 | Becker .......................... 428/325 |
| 6,794,030 B1 * | 9/2004 | Okada et al. .................. 428/343 |
| 6,940,722 B2 * | 9/2005 | Tetsuka et al. ................ 361/708 |

* cited by examiner

*Primary Examiner* — D. S. Nakarani
(74) *Attorney, Agent, or Firm* — Park & Associates IP Law, P.C.

(57) ABSTRACT

The present invention relates to a heat dissipation coating agent and to a heat-dissipating plate including same, which efficiently dissipate heat from the surface of a heat-dissipating plate of an electric/electronic component. Particularly, the heat dissipation coating agent, which is applied to the surface of a heat-dissipating plate of an electric/electronic component, includes infrared radiation powder and a binder, and the heat-dissipating plate is coated with a heat dissipation layer consisting of the heat dissipation coating agent. Since the heat dissipation coating agent applied to the heat-dissipating plate is highly conductive, heat is emitted from the heat-dissipating plate by conduction as well as convection. In particular, the heat dissipation coating agent, which conducts heat with high conductivity, can be applied to a heat-dissipating plate of a high-power LED light source.

10 Claims, No Drawings

HEAT DISSIPATION COATING AGENT AND HEAT-DISSIPATING PLATE INCLUDING SAME

REFERENCE TO RELATED APPLICATIONS

This is a continuation of pending International Patent Application PCT/KR2010/003052 filed on May 14, 2010, which designates the United States and claims priority of Korean Patent Application No. 10-2010-0004895 filed on Jan. 19, 2010, the entire contents of which are incorporated herein by reference.

FIELD OF THE INVENTION

The present invention relates to a heat dissipation coating agent, wherein the surface of a heat-dissipating plate of an electric/electronic part is coated with a material having high emissivity so as to efficiently dissipate heat from the electric/electronic part via radiation as well as convection, and to a heat-dissipating plate including the same.

BACKGROUND OF THE INVENTION

The heat generated by electric/electronic parts negatively affects the parts or the other peripheral parts, undesirably deteriorating the performance of the parts or shortening the lifetime thereof. To solve this problem, a water cooling process using a solvent such as water is utilized to forcibly decrease the temperature of the surface, or a natural cooling process using convection of air is employed on the surface area of parts, which is made large. As such, the water cooling process exhibits very high cooling effects but is disadvantageous because many devices such as additional devices for circulating water and for storing water must be installed, which leads to remarkably increased cost and large-sized installations. Also, the air cooling process manifests very low cooling effects, making it difficult to perform rapid cooling.

Meanwhile, the major reason in which electric/electronic parts have trouble is because of the heat generated by the parts. While a number of parts are carrying out their inherent functions, heat is generated, and there are often cases where such heat causes the parts to go out of service. A typical method of removing the generated heat includes using a fan or mounting a heat-dissipating plate having a large surface area at the end where heat is transferred to. Aluminum, which is mainly used for the heat-dissipating plate, has high heat conductivity, making it possible to efficiently transfer heat from the heat generation source to the surface, but aluminum does not effectively emit heat from the surface because of the emissivity of 30% or less.

Such an electric/electronic part, for example, an LED is receiving attention as a novel light source with low energy and high efficiency thanks to drastic advancement in recent years. However, in order to use the LED as a high-power lighting device, it is most important to solve heat dissipation problems. Although LED chips exhibit high luminous efficiency, the heat value thereof is considerable. Unless heat dissipation methods are provided, LED chips become too hot and the chips themselves or the packaging resin may deteriorate undesirably reducing the luminous efficiency and the lifetime of chips. To retain high efficiency and long lifetime, which are the advantages of LEDs, it is essential to develop techniques for diffusing the heat of chips to the outside.

LEDs, which are currently available, are configured such that heat generated therefrom is dissipated via the heat-dissipating plate provided on the rear surface thereof. Conventional techniques include Korean Patent No. 10-0910917 entitled "heat sink device of LED module for lighting equipment", Korean Patent No. 10-0670918 entitled "LED lamp having heat release structure", Korean Patent No. 10-0899977 entitled "heat sink device of LED lamp", Korean Patent No. 10-0910054 entitled "apparatus for radiating heat of LED lamp", Korean Patent Publication No. 10-2009-0108222 entitled "LED lighting device having multiple heat-dissipating structure", etc.

Most such conventional techniques are provided in such a manner that the heat-dissipating plate is formed on the rear surface of the LED or the heat dissipation structure is formed so as to be adjacent to the LED, and thus their heat dissipation designs lay emphasis on forms, coupling structures, configurations thereof, etc., and aluminum is mainly used therefor. Whereas aluminum having high heat conductivity may efficiently transfer heat from the heat generation source to the surface, the release of heat from the surface greatly depends on air convection because the emissivity of aluminum is 30% or less. In the case where the LED is employed in high-power lighting devices, there may still be heat dissipation problems.

SUMMARY OF THE INVENTION

Accordingly, the present invention has been made keeping in mind the above problems occurring in the related art, and an object of the present invention is to provide a heat dissipation coating agent and a heat-dissipating plate including the same, in which the surface of a heat-dissipating plate of an electric/electronic part is coated with a material having high emissivity while a conventional heat-dissipating plate structure for an electric/electronic part is used unchanged, thus achieving efficient heat dissipation from the surface of the heat-dissipating plate via radiation as well as convection which is conventionally used.

In order to accomplish the above object, the present invention provides a heat dissipation coating agent, which comprises infrared radiation powder and a binder and is applied on the surface of a heat-dissipating plate of an electric/electronic part, and a heat-dissipating plate having a heat dissipation coating layer formed on the surface thereof using the heat dissipation coating agent.

Also, primer treatment may be performed between the heat-dissipating plate and the heat dissipation coating layer, and a protective layer may be further formed on the surface of the heat dissipation coating layer.

The infrared radiation powder may be any one or a mixture of two or more selected from among jade, sericite, cordierite, germanium, iron oxide, mica, manganese dioxide, silicon carbide, Macsumsuk, carbon, copper oxide, cobalt oxide, nickel oxide, antimony pentoxide ($Sb_2O_5$), tin oxide ($SnO_2$), and chromium oxide ($Cr_2O_3$).

The binder may be any one selected from among a silane binder, an organic binder, a silicon compound binder, an inorganic binder, an organic-inorganic hybrid binder, and glass frit.

As such, the silane binder may include silane having four alkoxy groups, and the silane having four alkoxy groups may include one or more selected from among tetramethoxysilane, tetraethoxysilane, tetra-n-propoxysilane, tetra-i-propoxysilane, and tetra-n-butoxysilane, and the silane binder may include, as the functional organic alkoxy silane, silane having one or more functional groups selected from among an acryl group, a methacryl group, an allyl group, an alkyl group, a vinyl group, an amine group and an epoxy group, and the functional alkoxy silane may include any one selected from the group consisting of trialkoxysilanes selected from among methyltrimethoxysilane, methyltriethoxysilane, ethyltrimethoxysilane, ethyltriethoxysilane, n-propyltrimethoxysilane, n-propyltriethoxysilane, i-ropyltrimethoxysilane, i-propyltriethoxysilane, n-butyltrimethoxysilane, n-butyltriethoxysilane, n-pentyltrimethoxysilane, n-hexyltrimethoxysilane, n-heptyltrimethoxysilane, n-octyltrimethoxysilane, vinyltrimethoxysilane, vinyltriethoxysilane, cyclohexyltrimethoxysilane, cyclohexyltriethoxysilane, phenyltrimethoxysilane, phenyltriethoxysilane, 3-chloropropyltrimethoxysilane, 3-chloropropyltriethoxysilane, 3,3,3-trifluoropropyltrimethoxysilane, 3,3,3-trifluoropropyltriethoxysilane, 3-aminopropyltrimethoxysilane, 3-aminopropyltriethoxysilane, 2-hydroxyethyltrimethoxysilane, 2-hydroxyethyltriethoxysilane, 2-hydroxypropyltrimethoxysilane, 2-hydroxypropyltriethoxysilane, 3-hydroxypropyltrimethoxysilane, 3-hydroxypropyltriethoxysilane, 3-mercaptopropyltrimethoxysilane, 3-mercaptopropyltriethoxysilane, 3-isocyanatepropyltrimethoxysilane, 3-isocyanatepropyltriethoxysilane, 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, 3-(meth)acryloxypropyltrimethoxysilane, 3-(meth)acryloxypropyltriethoxysilane, 3-ureidopropyltrimethoxysilane, 3-ureidopropyltriethoxysilane and mixtures thereof; dialkoxysilanes selected from among dimethyldimethoxysilane, dimethyldiethoxysilane, diethyldimethoxysilane, diethyldiethoxysilane, di-n-propyldimethoxysilane, di-n-propyldiethoxysilane, di-i-propyldimethoxysilane, di-i-propyldiethoxysilane, di-n-butyldimethoxysilane, di-n-butyldiethoxysilane, di-n-pentyldimethoxysilane, di-n-pentyldiethoxysilane, di-n-hexyldimethoxysilane, di-n-heptyldimethoxysilane, di-n-heptyldiethoxysilane, di-n-octyldimethoxysilane, di-n-octyldiethoxysilane, di-n-cyclohexyldimethoxysilane, di-n-cyclohexyldiethoxysilane, diphenyldimethoxysilane, diphenyldiethoxysilane and mixtures thereof; and mixtures thereof.

The organic binder may be any one selected from among an organic polymer containing, at both ends of a carbon chain or a side chain, at least one functional group selected from among a vinyl group, an acryl group, an ester group, a urethane group, an epoxy group, an amino group, an imide group, each of which is thermopolymerizable, and an organic functional group which is thermocurable, and an organic polymer containing, at both ends of a carbon chain or a side chain, at least one functional group selected from among a vinyl group, an allyl group, an acryl group, a methacrylate group, each of which is photopolymerizable, and an organic functional group which is photocurable, and part of hydrogens of a hydrocarbon group of the organic polymer may be substituted with fluorine.

The silicon compound binder may include, as an organic-inorganic hybrid material, a material comprising siloxane (—Si—O—) and a linear, branched or cyclic hydrocarbon group at any one of four bonding portions of a silicon atom thereof, and the hydrocarbon group may have any one or a mixture of two or more selected from among an alkyl group, a ketone group, an acryl group, a methacryl group, an allyl group, an alkoxy group, an aromatic group, an amino group, an ether group, an ester group, a nitro group, a hydroxyl group, a cyclobutene group, a carboxyl group, an alkyd group, a urethane group, a vinyl group, a nitrile group, hydrogen and an epoxy group, or part of hydrogens of the hydrocarbon group may be substituted with fluorine.

The inorganic binder may be formed by adding a material including one or more ions selected from among $Li^+$, $Na^+$, $K^+$, $Mg^{2+}$, $Pb^{2+}$, and $Ca^{2+}$ to water-dispersed colloidal silica, and the material including one or more ions selected from among $Li^+$, $Na^+$, $K^+$, $Mg^{2+}$, $Pb^{2+}$, and $Ca^{2+}$ may be a hydroxide, including LiOH, NaOH, KOH, $Mg(OH)_2$, $Pb(OH)_2$, $Ca(OH)_2$.

The organic-inorganic hybrid binder may be formed by mixing 100 parts by weight of colloidal inorganic particles with 0.1~150 parts by weight of silane or 0.1~150 parts by weight of an organic resin.

The colloidal inorganic particles may be one or more selected from among silica, alumina, magnesium oxide, titania, zirconia, tin oxide, zinc oxide, barium titanate, zirconium titanate and strontium titanate.

According to the present invention, while a conventional heat-dissipating plate structure for an electric/electronic part is used as it is, the surface of the heat-dissipating plate of an electric and electronic part is coated with a heat dissipation coating agent having high emissivity, thus increasing the emissivity of the heat-dissipating plate to thereby efficiently dissipate heat via radiation as well as convection by the conventional heat-dissipating plate, resulting in increased dissipation efficiency.

In the case of the electric/electronic part, in particular, an LED light source, this coating agent can be applied on the surface of the heat-dissipating plate of the LED light source so as to efficiently dissipate heat via high radiation, which leads to contributing to achieving actual use of high-power LED light sources.

DETAILED DESCRIPTION OF THE INVENTION

Best Mode

According to the present invention, the surface of a heat-dissipating plate of an electric/electronic part is coated with a heat dissipation coating agent having high emissivity, so that heat is efficiently released from the surface of the heat-dissipating plate via thermal radiation. In particular, such a coating agent is applied on the surface of the aluminum heat-dissipating plate of an electric/electronic part or the aluminum heat-dissipating plate of an LED light source, thus efficiently emitting heat. As used herein, the term "a heat-dissipating plate of an electric/electronic part" means not only a heat-dissipating plate having a heat dissipation structure separately attached to an electric/electronic part, but also the heat dissipation structure of the surface itself of an electric/electronic part, which is able to emit heat from the electric/electronic part, as is apparent to those skilled in the art.

The heat dissipation coating agent is composed of infrared radiation powder and a binder and is applied on the surface of the heat-dissipating plate of the electric/electronic part, etc., and the infrared radiation powder includes any one or a mixture of two or more selected from among jade, sericite, cordierite, germanium, iron oxide, mica, manganese dioxide, silicon carbide, Macsumsuk, carbon, copper oxide, cobalt oxide, nickel oxide, antimony pentoxide ($Sb_2O_5$), tin oxide ($SnO_2$), and chromium oxide ($Cr_2O_3$). The binder includes any one selected from among a silane binder, an organic binder, a silicon compound binder, an inorganic binder, an organic-inorganic hybrid binder, and glass frit.

Also, primer treatment is performed between the heat-dissipating plate and the heat dissipation coating layer, thus enhancing the adhesion of the heat dissipation coating layer. The primer includes silane, an organic resin, a silicon compound, an inorganic binder, an organic-inorganic hybrid binder, and glass frit.

Also, a protective layer is further formed on the surface of the heat dissipation coating layer in order to protect the heat dissipation coating layer and to make the surface thereof smooth, and the protective layer is made of any one material selected from among silane, an organic resin, a silicon compound, an inorganic binder, an organic-inorganic hybrid binder, and glass frit.

The silane binder includes silane having four alkoxy groups, and the silane having four alkoxy groups may include one or more selected from among tetramethoxysilane, tetraethoxysilane, tetra-n-propoxysilane, tetra-i-propoxysilane, and tetra-n-butoxysilane, and the silane binder includes, as a functional organic alkoxy silane, silane having one or more functional groups selected from among an acryl group, a methacryl group, an allyl group, an alkyl group, a vinyl group, an amine group and an epoxy group, and the functional alkoxy silane includes any one selected from the group consisting of trialkoxysilanes selected from among methyltrimethoxysilane, methyltriethoxysilane, ethyltrimethoxysilane, ethyltriethoxysilane, n-propyltrimethoxysilane, n-propyltriethoxysilane, i-propyltrimethoxysilane, i-propyltriethoxysilane, n-butyltrimethoxysilane, n-butyltriethoxysilane, n-pentyltrimethoxysilane, n-hexyltrimethoxysilane, n-heptyltrimethoxysilane, n-octyltrimethoxysilane, vinyltrimethoxysilane, vinyltriethoxysilane, cyclohexyltrimethoxysilane, cyclohexyltriethoxysilane, phenyltrimethoxysilane, phenyltriethoxysilane, 3-chloropropyltrimethoxysilane, 3-chloropropyltriethoxysilane, 3,3,3-trifluoropropyltrimethoxysilane, 3,3,3-trifluoropropyltriethoxysilane, 3-aminopropyltrimethoxysilane, 3-aminopropyltriethoxysilane, 2-hydroxyethyltrimethoxysilane, 2-hydroxyethyltriethoxysilane, 2-hydroxypropyltrimethoxysilane, 2-hydroxypropyltriethoxysilane, 3-hydroxypropyltrimethoxysilane, 3-hydroxypropyltriethoxysilane, 3-mercaptopropyltrimethoxysilane, 3-mercaptopropyltriethoxysilane, 3-isocyanatepropyltrimethoxysilane, 3-isocyanatepropyltriethoxysilane, 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, 3-(meth)acryloxypropyltrimethoxysilane, 3-(meth)acryloxypropyltriethoxysilane, 3-ureidopropyltrimethoxysilane, 3-ureidopropyltriethoxysilane and mixtures thereof; dialkoxysilanes selected from among dimethyldimethoxysilane, dimethyldiethoxysilane, diethyldimethoxysilane, diethyldiethoxysilane, di-n-propyldimethoxysilane, di-n-propyldiethoxysilane, di-i-propyldimethoxysilane, di-i-propyldiethoxysilane, di-n-butyldimethoxysilane, di-n-butyldiethoxysilane, di-n-pentyldimethoxysilane, di-n-pentyldiethoxysilane, di-n-hexyldimethoxysilane, di-n-heptyldimethoxysilane, di-n-heptyldiethoxysilane, di-n-octyldimethoxysilane, di-n-octyldiethoxysilane, di-n-cyclohexyldimethoxysilane, di-n-cyclohexyldiethoxysilane, diphenyldimethoxysilane, diphenyldiethoxysilane and mixtures thereof; and mixtures thereof.

The organic binder includes any one selected from among an organic polymer containing, at both ends of a carbon chain or a side chain, at least one functional group selected from among a vinyl group, an acryl group, an ester group, a urethane group, an epoxy group, an amino group, an imide group, each of which is thermopolymerizable, and an organic functional group which is thermocurable, and an organic polymer containing, at both ends of a carbon chain or a side chain, at least one functional group selected from among a vinyl group, an allyl group, an acryl group, a methacrylate group, each of which is photopolymerizable, and an organic functional group which is photocurable, and part of the hydrogens of a hydrocarbon group of the organic polymer is substituted with fluorine.

The silicon compound binder includes, as an organic-inorganic hybrid material, a material composed of siloxane (—Si—O—) and a linear, branched or cyclic hydrocarbon group at any one of four bonding portions of the silicon atom of the siloxane, and the hydrocarbon group has any one or a mixture of two or more selected from among an alkyl group, a ketone group, an acryl group, a methacryl group, an allyl group, an alkoxy group, an aromatic group, an amino group, an ether group, an ester group, a nitro group, a hydroxyl group, a cyclobutene group, a carboxyl group, an alkyd group, a urethane group, a vinyl group, a nitrile group, hydrogen and an epoxy group, or part of hydrogens of the hydrocarbon group is substituted with fluorine.

The inorganic binder includes a material including one or more ions selected from among $Li^+$, $Na^+$, $K^+$, $Mg^{2+}$, $Pb^{2+}$, and $Ca^{2+}$ added to water-dispersed colloidal silica, and may include hydroxides, such as LiOH, NaOH, KOH, $Mg(OH)_2$, $Pb(OH)_2$, $Ca(OH)_2$.

The organic-inorganic hybrid binder is formed by mixing 100 parts by weight of colloidal inorganic particles with 0.1~150 parts by weight of silane or 0.1~150 parts by weight of an organic resin, and the colloidal inorganic particles may include one or more selected from among silica, alumina, magnesium oxide, titania, zirconia, tin oxide, zinc oxide, barium titanate, zirconium titanate and strontium titanate.

The glass frit binder is obtained by melting a glass composition at high temperature, cooling it and then forming it into powder or pieces, and may be widely used for protective coating or sealing, and may have different melting temperatures depending on the composition thereof. The glass frit is present in the form of a solid phase at room temperature, but may be provided in a liquid phase at increased temperature and thus may be used as a binder. When glass frit is adhered in a liquid phase and then cooled, it adheres in the form of a solid phase.

Below is a description of preferred examples of the present invention.

EXAMPLE 1

In order to evaluate heat dissipation effects of a heat dissipation coating agent, the aluminum heat-dissipating plate of a 40 W LED for lighting devices was treated to create the following three samples: one wherein no treatment was performed, one wherein a heat dissipation coating agent was applied, and one wherein anodizing was performed. The extent of temperature reductions of the PCBs of the LEDs was then measured.

The heat dissipation coating agent used therefor was composed of 100 parts by weight of a silicon compound binder, 150 parts by weight of infrared radiation powder (jade: 20~30%, SiC: 50~70%, cordierite: 10~20%, tin oxide: 1~3%, manganese oxide: 1~5%) and 50 parts by weight of toluene for reducing viscosity, which were mixed for 2 hours using a ball mill. The surface of the heat-dissipating plate was coated with this heat dissipation coating agent using a dipping process.

The results of measuring the temperature of the upper surface of the PCB of the LED were as follows.

Sample 1: aluminum heat-dissipating plate on which no surface treatment was performed: 77° C.

Sample 2: aluminum heat-dissipating plate on which anodizing treatment was performed (thickness: 15 μm): 76.2° C.

Sample 3: aluminum heat-dissipating plate on which a heat dissipation coating agent was applied (thickness: 15 µm): 71.1° C.

In the case where the aluminum heat-dissipating plate was coated with the heat dissipation coating agent according to the present invention to form the heat dissipation coating layer, temperature reduction effects of the PCB of the LED were the greatest. This is because heat is more efficiently dissipated from the surface of the aluminum heat-dissipating plate via radiation thanks to the use of the heat dissipation coating agent as well as air convection.

EXAMPLE 2

In order to evaluate heat dissipation effects of a heat dissipation coating agent, the aluminum heat-dissipating plate of a 40 W LED for lighting devices was treated to create the following three samples: one wherein no treatment was performed, one wherein a heat dissipation coating agent was applied, and one wherein anodizing was performed. The extent of temperature reductions of the PCBs of the LEDs was then measured.

The heat dissipation coating agent used therefor was composed of 100 parts by weight of an epoxy organic binder (main component: 100%, curing agent: 30%), 150 parts by weight of infrared radiation powder (jade: 20~30%, SiC: 50~70%, cordierite: 10~20%, sericite: 1~3%, carbon: 1~3%, manganese dioxide: 1~5%) and 50 parts by weight of toluene for reducing viscosity, which were mixed for 2 hours using a ball mill. The surface of the heat-dissipating plate was coated with this heat dissipation coating agent using a dipping process.

The results of measuring the temperature of the upper surface of the PCB of the LED were as follows.

Sample 1: aluminum heat-dissipating plate on which no surface treatment was performed: 77° C.

Sample 2: aluminum heat-dissipating plate on which anodizing treatment was performed (thickness: 15 µm): 76.2° C.

Sample 3: aluminum heat-dissipating plate on which a heat dissipation coating agent was applied (thickness: 15 µm): 71.0° C.

In the case where heat-dissipating coating was performed on the aluminum heat-dissipating plate, temperature reduction effects of the PCB of the LED were the greatest. This is because heat is more efficiently dissipated from the surface of the aluminum heat-dissipating plate via radiation thanks to the use of the heat dissipation coating agent as well as air convection.

The present invention can be applied to a heat dissipation coating agent and a heat-dissipating plate including the same, wherein the surface of a heat-dissipating plate of an electric/electronic part is coated with a material having high emissivity, thus efficiently dissipating heat from the electric/electronic part via convection and radiation.

What is claimed is:

1. A heat dissipation structure, comprising a heat dissipation coating agent applied on at least a portion of an outer surface of said heat dissipation structure, wherein the heat dissipation coating agent comprises an infrared radiation powder and an organic-inorganic hybrid binder including 100 parts by weight of colloidal inorganic particles and 0.1~150 parts by weight of silane or 0.1~150 parts by weight of an organic resin.

2. The heat dissipation structure of claim 1, wherein the infrared radiation powder is one or a combination of two or more substances selected from the group consisting of jade, sericite, cordierite, germanium, iron oxide, mica, manganese dioxide, silicon carbide, carbon, copper oxide, cobalt oxide, nickel oxide, antimony pentoxide ($Sb_2O_5$), tin oxide ($SnO_2$), and chromium oxide ($Cr_2O_3$).

3. The heat dissipation structure of claim 1, wherein the organic-inorganic hybrid binder includes at least one organic binder selected from the group consisting of:

first organic polymer containing a hydrocarbon group, and at least one functional group attached at both ends of a carbon chain or a side chain, wherein said functional group is selected from the group consisting of a vinyl group, an acryl group, an ester group, a urethane group, an epoxy group, an amino group and an imide group, each of which is either thermopolymerizable or thermocurable; and second organic polymer containing a hydrocarbon group, and at least one functional group attached at both ends of a carbon chain or a side chain, wherein said functional group selected from the group consisting of a vinyl group, an allyl group, an acryl group, a methacrylate group, each of which is photopolymerizable or photocurable.

4. The heat dissipation structure of claim 3, wherein the hydrocarbon group of the first and the second organic polymers has at least one of its hydrogen atom substituted with fluorine.

5. The heat dissipation structure of claim 1, wherein the colloidal inorganic particles include one or more selected from the group consisting of silica, alumina, magnesium oxide, titania, zirconia, tin oxide, zinc oxide, barium titanate, zirconium titanate and strontium titanate.

6. The heat-dissipating structure of claim 1, further comprising a protective layer formed on a heat dissipation layer formed by the heat dissipation coating agent.

7. The heat-dissipating structure of claim 6, further comprising a primer layer formed between the outer surface of heat-dissipating structure and the heat dissipation coating layer.

8. The heat-dissipating structure of claim 7, wherein the primer layer comprises any one selected from the group consisting of silane, an organic resin, a silicon compound, an inorganic binder, an organic-inorganic hybrid binder and a glass frit.

9. The heat-dissipating structure of claim 6, wherein the protective layer comprises any one material selected from the group consisting of silane, an organic resin, a silicon compound, an inorganic binder, an organic-inorganic hybrid binder and a glass frit.

10. The heat dissipation structure of claim 1, wherein the heat-dissipating structure is a heat-dissipating plate of a light emitting diode.

* * * * *